United States Patent
Takahashi

(10) Patent No.: US 6,400,027 B1
(45) Date of Patent: *Jun. 4, 2002

(54) SEMICONDUCTOR DEVICE HAVING MICRO-WIRES DESIGNED FOR REDUCED CAPACITIVE COUPLING

(75) Inventor: Kiyoshi Takahashi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/041,737

(22) Filed: Mar. 13, 1998

(30) Foreign Application Priority Data

Mar. 14, 1997 (JP) .............................. 9-082068

(51) Int. Cl.[7] .......................... H01L 23/48; H01L 23/52; H01L 29/40
(52) U.S. Cl. ......................... 257/773; 257/522; 257/531
(58) Field of Search ................................ 257/773, 739, 257/758, 775, 522, 531, 277, 534; 438/579, 578, 574, 622, 421, 422

(56) References Cited

U.S. PATENT DOCUMENTS

| | | | |
|---|---|---|---|
| 5,357,403 A | * | 10/1994 | Haller et al. ................. 257/724 |
| 5,432,126 A | * | 7/1995 | Oikawa ....................... 438/571 |
| 5,652,157 A | * | 7/1997 | Hirano et al. ................ 438/182 |
| 5,776,828 A | * | 7/1998 | Givens ........................ 438/631 |

FOREIGN PATENT DOCUMENTS

| JP | 61-269355 | 11/1986 |
|---|---|---|
| JP | 5-109708 | 4/1993 |

OTHER PUBLICATIONS

Hirano et al., "Preparation of a U–Shaped Micro–Wire Technology for GaAs ICs", *Institute of Electronic, Information and Communication Engineers.* C–82, 1992, pp. 2–420.

* cited by examiner

*Primary Examiner*—Phat X. Cao
(74) *Attorney, Agent, or Firm*—Sughrue Mion, PLLC

(57) ABSTRACT

Semiconductor device in which wiring surface area is increased while the increase of the capacitance between adjacent micro-wires is inhibited. The device can be prepared by forming an insulating layer and a plating feed layer in this order on a semiconductor substrate, plating after masking the plating feed layer with a first photoresist to form a gold plating, etching off the gold plating and the plating feed layer except for a wiring portion by dry-etching after masking the resultant surface with a second photoresist, removing then the first and second photoresists to form micro-wires, in which the same direction of the side portion is opened. The cross section may be U-shape arranged with U being turned sideways.

8 Claims, 5 Drawing Sheets

11; SEMICONDUCTOR SUBSTRATE
12; INSULATING FILM
13; PLATING FEED LAYER
14-1, 14-2; PHOTO RESIST
15; GOLD PLATING

21; UNDER-LAYER WIRING

11; SEMICONDUCTOR SUBSTRATE
12; INSULATING FILM
13; PLATING FEED LAYER
14-1, 14-2; PHOTO RESIST
15; GOLD PLATING

21; UNDER-LAYER WIRING

SEMICONDUCTOR DEVICE HAVING MICRO-WIRES DESIGNED FOR REDUCED CAPACITIVE COUPLING

FIELD OF THE INVENTION

This invention relates to a semiconductor device, more especially to a semiconductor device comprising micro-wires of a preferable shape for use in a high-frequency semiconductor device.

BACKGROUND OF THE INVENTION

Recently, progress has been made in the development of a high-frequency integrated semiconductor such as GaAs integrated semiconductors which operate over a wide range of frequencies, spanning from a few GHz to 100 GHz. Wiring within these semiconductors is accomplished using microstrip lines. Transmission loss of signals traveling in the microstrip lines is a problem caused by increased resistance due to skin effect accompanied by the use of high frequency signals.

In order to reduce the increased of resistance due to skin effect, increasing the surface area of wiring is considered effective and a variety of processes for increasing the surface area of wiring have been hitherto known.

These examples include a process for increasing the film thickness of wiring as shown in FIG. 4(b) and a process for increasing the film thickness of wiring and then making the cross-section of micro-wires U-shaped as shown in FIG. 4(c) wherein both ends of the micro-wire are extended perpendicularly toward its substrate. As to the U-shaped micro-wire, reference can be made in the description of e.g., Hirano et al., "Preparation of a U-shaped micro-wire for MMIC" in the papers C-82 of the autumn meeting (1992) of Institute of Electronic, Information and Communication Engineers.

Japanese Patent Kokai Publication JP-A-5-109708 (1993) discloses the shape of a micro-wire like a coaxial line as shown in FIG. 4(d) obtained by forming an insulating film 16 embedded inside rectangular micro-wires. This publication discloses a wiring system comprising micro-wires of a cross-sectional shape formed by encompassing entirely all the four peripheries of the insulating film 16 with metal conductor 15 that is fundamental wiring material, wherein the conductor, which constitutes a micro-wire, has not only the surface(interface) facing the outside insulating film but also the surface(interface) facing the insulating film 16 embedded inside, whereby the influence of the skin effect is inhibited to surpress the increase of wiring resistance even when high-frequency operation is performed.

The conventional processes disclosed above obtain the effect of reducing the increased wiring resistance by increasing the surface of wiring.

SUMMARY OF THE DISCLOSURE

In the course of investigations toward the present invention, the following problems have been encountered.

In order to reduce a chip area so as to form a highly integrated semiconductor and lower the chip cost, reducing the width of a micro-wire and the space(distance) between adjacent micro-wires is generally considered the most effective means. However, this makes the space between adjacent micro-wires narrow and the area of the adjacent side portions of micro-wires is increased. Accordingly, thick-film wiring as shown in FIGS. 4 (b) and (c) increases the capacitance between adjacent micro-wires more than that of the normal wiring shown in FIG. 4(a).

Now, a case is taken as an example in FIG. 4(a), 12 denotes an insulating film, 13 denotes a plating feed layer, and 15 denotes a gold plating. Each of micro-wires shown in FIG. 4(b) has a thickness of 2 $\mu$m, width of 10 $\mu$m and a space between adjacent micro-wires of 10 $\mu$m, and each of micro-wires having a U-shaped cross-section shown in FIG. 4(c) has a thickness of 4 $\mu$m which is 2 times larger than the former, width of 5 $\mu$m and the space between adjacent micro-wires of 5 $\mu$m. In this case, the wiring surface area of the latter is 2.8 times larger than that of the former, which reduces by approximately 30% the wiring resistance caused by the skin effect. However, the latter has a capacitance of 20 $\mu$F-40 $\mu$m between two adjacent lines of 100 $\mu$m length which is 4 times greater than that of the former.

In cases where such microstrip lines are applied to spiral inductances which are passive elements of a high-frequency integrated semiconductor, the wiring length does not differ so that the inductance is nearly the same. However, resonant frequency f is reduced in proportion to an increase in the capacitance between adjacent micro-wires in accordance with the following formula (1).

$$f = \frac{1}{2\pi} \sqrt{\frac{1}{2LC}}$$

Consequently, the frequency band in which the spiral inductance can be operated shifts to become low, causing problems in the operation of the integrated semiconductor.

Accordingly, the present invention has been made in order to solve the aforementioned problems involved in the prior art. It is an object of the present invention is to provide a semiconductor device in which the surface area of wiring is increased and the capacitance between adjacent micro-wires is inhibited in a high-frequency integrated semiconductor device.

Further objects or aspects of the present invention will become apparent in the disclosure below.

In short, for attaining the above object, the present invention is based on a wiring structure (i.e., cross sectional shape) that increases the surface area of wiring without increasing the capacitance between adjacent micro-wires by providing a cross-sectional shape of micro-wires whose side portion is partially open (or recessed or bored).

According to an aspect of the present invention, micro-wires formed on an insulating layer applied to a semiconductor substrate with active elements and the like thereon may have a cross-sectional shape of micro-wires in which a side(direction) of both side portions is open to provide a hollow inside in each of the micro-wires.

According to a second aspect of the present invention, the open side portion of the micro-wire may be in the same direction(side) as that of the adjacent micro-wire.

As an alternative, the open side portion of the micro-wire may oppose to that of the adjacent micro-wire. That is, the open sides of the neighboring micro-wires oppose each other.

DESCRIPTION OF THE PREFERRED EMBODIMENTS

The preferred embodiments of the present invention will be described in detail as follows.

In a preferred embodiment, the semiconductor device comprises a wiring system comprising micro-wires having a cross-section of reversed L-shape, formed by providing an opening (or recess) to a metal conductor, constituting wiring material, of either side portion along its longitudinal direction, with a foot portion of "L" being placed on an insulating film and an arm portion being supported thereby on one side (like a cantilever support).

More particularly, the semiconductor device of the present invention comprises in its preferred embodiment a semiconductor substrate (11 in FIG. 1) and, an insulating film (12 in FIG. 1) and a plating feed layer (13 in FIG. 1) formed to be layered in this order. A gold plating (15 in FIG. 1) is formed on the plating feed layer masked with a first photoresist (14-1 in FIG. 1). After masking the gold plating with a second photoresist (14-2), the gold plating and the plating feed layer except for a wiring portion are etched off by dry etching. The first and second photoresists are then removed. By these steps the side portion of micro-wires can be etched. to form wiring comprising micro-wires of a gold plating having a cross-section of the reverse L shape in one embodiment of the present invention.

Figure 4A:
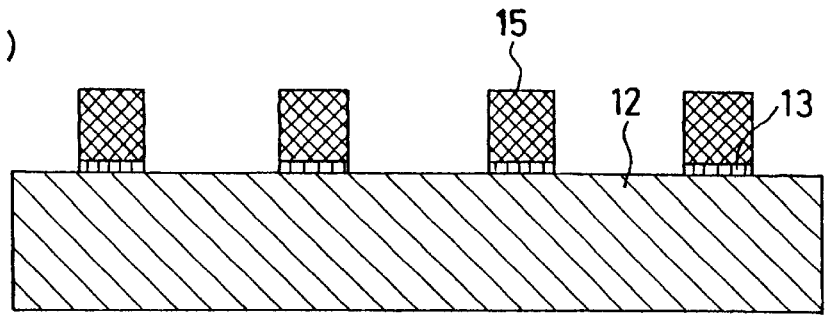
FIG. 4 is a cross-sectional view showing several embodiments of the conventional wiring.
Figure 4B:
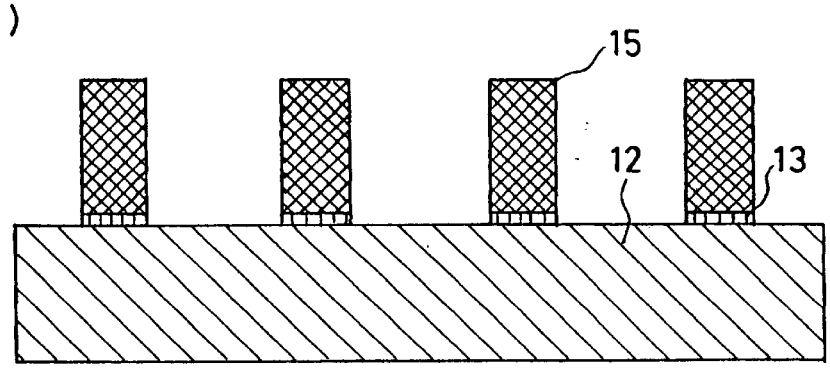
Figure 4C:
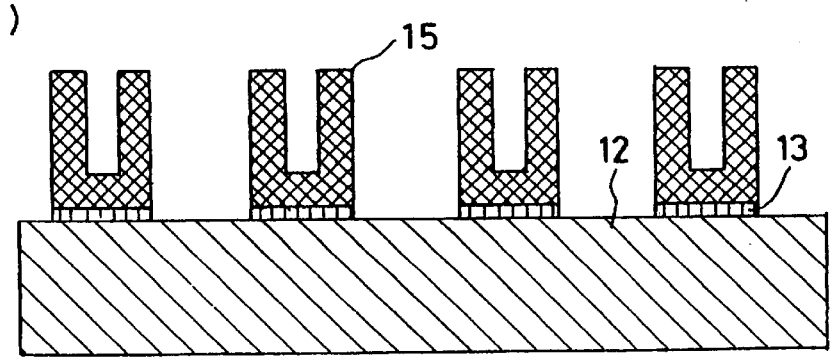
Figure 4D:
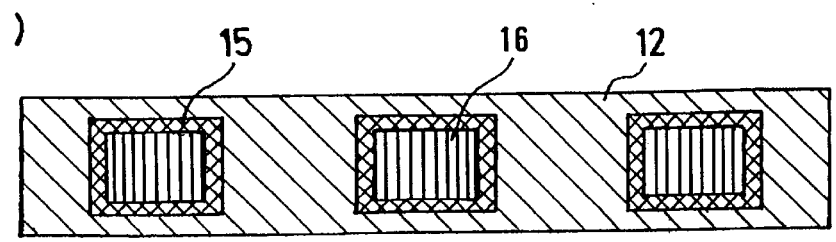

In the embodiment of the present invention, the space between the sides of adjacent micro-wires is equivalent to (L+S), the sum of the space between adjacent micro-wires (S) and the width of wiring (L). In contrast thereto, in the usual wiring system as shown in FIG. 4(a) the space between the sides of adjacent micro-wires is equal to the space between adjacent micro-wires (S). Accordingly, the space between the sides of adjacent micro-wires in the embodiment of the present invention is wider than that in the usual system by the difference of the width of wiring (L), which results in corresponding lowering in the capacitance between adjacent micro-wires. (The capacitance between adjacent micro-wires is principally Proportional to the side surface area of adjacent micro-wires and inversely proportional to the distance (space) between the sides of adjacent micro-wires.)

In another embodiment of the present invention, the opening-ends of adjacent micro-wires may be opposed to each other.

EXAMPLES

The present invention is explained in more detail below by describing specific examples with reference to the annexed drawings.

FIG. 1 shows a cross-sectional view showing a first example of the semiconductor device of the present invention in the order of its preparation steps.

At first, a plating feed layer 13 is formed on an insulating film 12 laid on a semiconductor substrate 11 by sputtering or other method (see FIG. 1 (a)).

Next, on the plating feed layer 13, photoresist 14-1 is coated and then exposed and developed in accordance with usual lithographic technology to form a predetermined pattern (see FIG. 1 (b)).

Figure 1A:
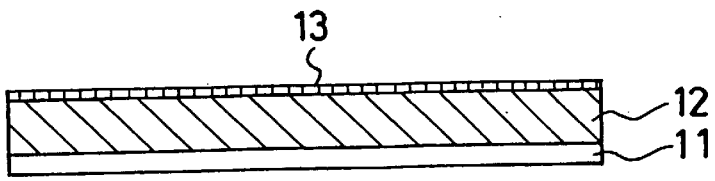
FIG. 1 is a cross-sectional view showing the steps of preparing a first embodiment of the present invention.
Figure 1B:
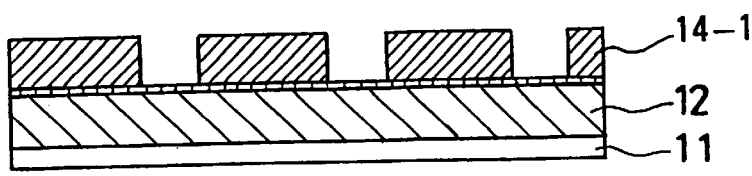
Figure 1C:
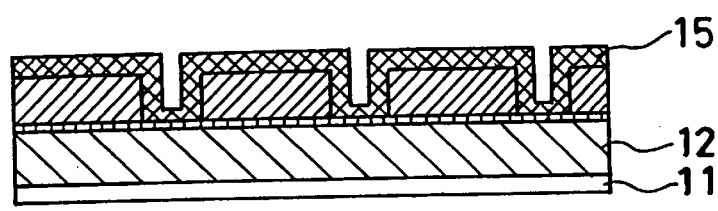

Then, a plating feed layer 13 is applied by spattering etc. and a gold plating 15 of around 300 nm thick is applied using electro- or electroless-plating etc. to form a wiring portion (see FIG. 1(c)).

Figure 1D:
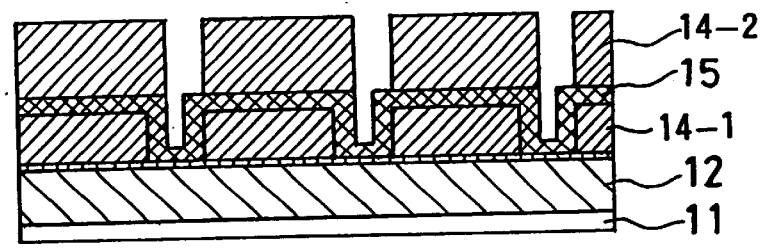

Subsequently, on the resultant gold plating 15, photoresist 14-2 is coated and then exposed and developed in accordance with usual lithographic technology to form a predetermined pattern (see FIG. 1(d)).

The gold plating 15 and the plating feed layer 13, except for the. wiring portion, are etched off by the application of an appropriate etching technology such as ionic milling etc. Thereafter, the photoresists 14-1 and 14-2 are removed to form micro-wires in which the same direction of the side portion is opened so that the cross-section of the gold plate 15 has a reverse L-shape, or the sum cross-section of the plating feed layer 13 and the gold plating 15 has a U-shape, or a U-shape with U being turned sideways on one leg (see FIG. 1(e)).

In the wiring thus prepared, the space between the sides of adjacent micro-wires is equivalent to the sum of the space between adjacent micro-wires (S) and the width of wiring (L), thereby the distance is longer than that of micro-wires having the usual shape (see FIG. 4(a)) by the difference of the width of a micro-wire (L) (In other words, the space between the sides of adjacent micro-wires is wider than that of the usual micro-wires by the distance corresponding to the width of a micro-wire), which results in a corresponding lowering in the capacitance between adjacent micro-wires.

Figure 1E:
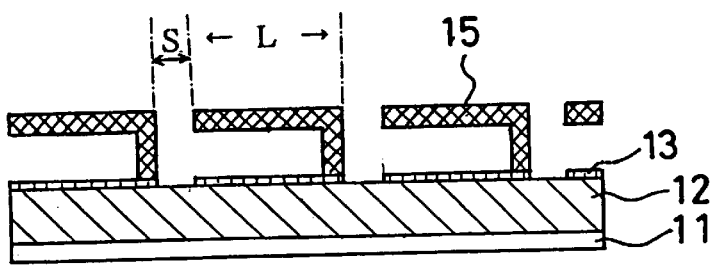
Figure 2:
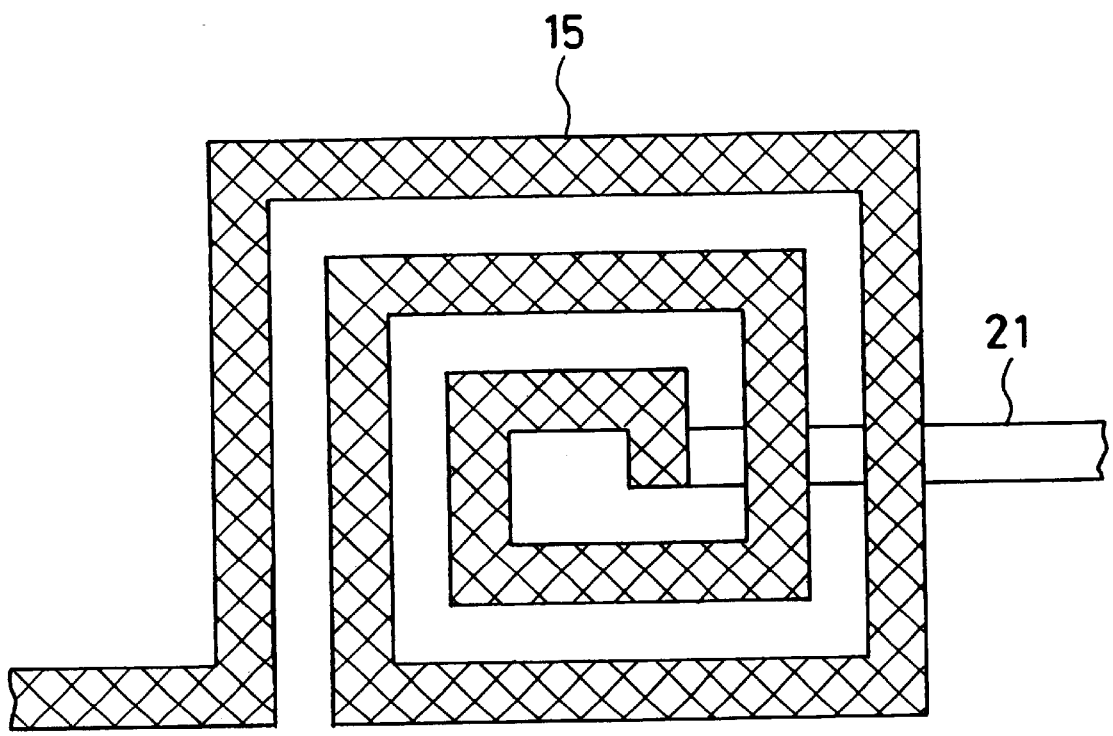
FIG. 2 is a plan view of a spiral inductor, the first embodiment of the present invention.

FIG. 2 is a plan view of a spiral inductor (a spiral conductor) prepared by using one example of the present invention. In FIG. 2, the cross-section of the gold plating 15 has such a reverse L-shape that the same direction of the side portion of micro-wires is opened as shown in FIG. 1(e).

The spiral inductor of the present example shown in FIG. 2 has a resonant frequency around 2 times greater than that of a spiral inductor having rectangular micro-wires (see FIG. 4(a)) with the same space between adjacent micro-wires and the same width of a micro-wire.

Now, a second example of the semiconductor device of the present invention is explained in detail below.

FIG. 3 shows a cross-sectional view showing the second example of the semiconductor device of the present invention in the order of its preparing steps.

Figure 3A:
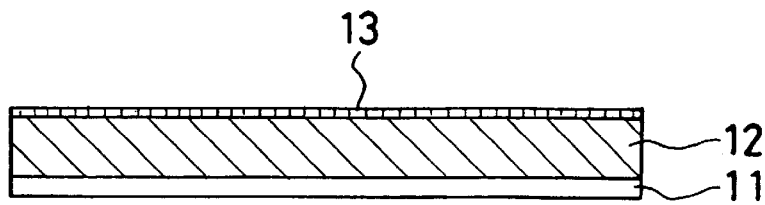
FIG. 3 is a cross-sectional view showing the steps of preparing a second embodiment of the present invention.

At first, a plating feed layer 13 is formed on an insulating film 12 laid on a semiconductor substrate 11 by sputtering or other method (see FIG. 3(a)).

Figure 3B:
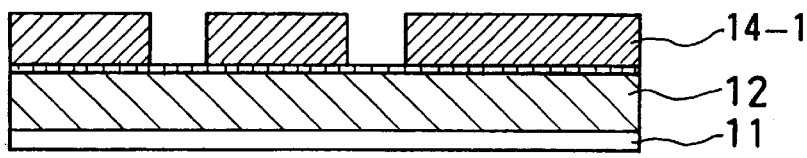

Next, on the plating feed layer 13, photoresist 14-1 is coated and then exposed and developed in accordance with usual lithographic technology to form a predetermined pattern (see FIG. 3(b)).

Figure 3C:
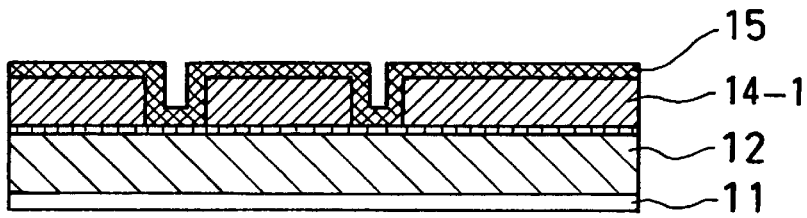

Then, a plating feed layer 13 is applied by sputtering etc., and a gold plating 15 of around 300 nm thick is applied using electro- or electroless-plating etc. to form a wiring portion (see FIG. 3(c)).

Figure 3D:
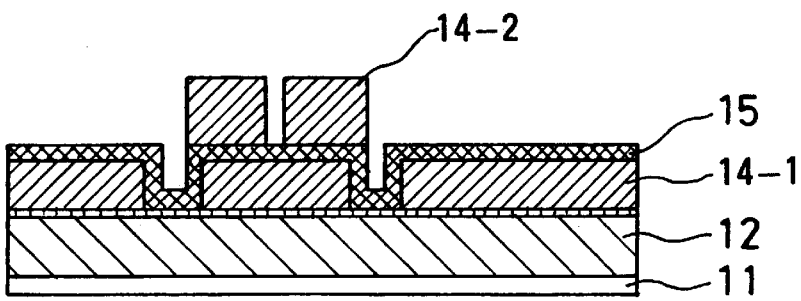

Subsequently, on the resultant gold plating 15, photoresist 14-2 is coated and then exposed and developed in accordance with usual lithographic technology to form a predetermined pattern (see FIG. 3(d)).

Figure 3E:
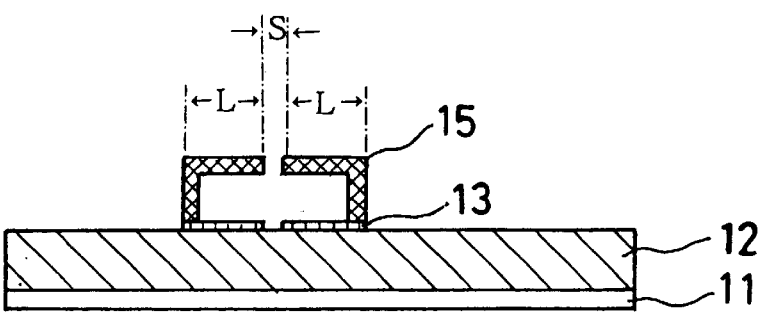

Then, the gold plating 15 and the plating feed layer 13 except for the wiring portion are etched off by applying an appropriate etching technology such as ionic milling etc., and the photoresists 14-1 and 14-2 are removed to form micro-wires in which the opposite directions of the side portions are opened-so that the cross-section of the gold plate 15 has a reverse L-shape, or the cross-section of the plating feed layer 13 and the gold plating 15 has a U-shape, or U-shape with U being turned sideways on one leg (see FIG. 3(e)).

In the wiring thus prepared, the space between adjacent micro-wires is equivalent to (2L+S), the sum of 2 times of the width of a micro-wire (2L) and the space between adjacent micro-wires (S). By this measure, the distance is longer than that of the first example by the difference of the width of a micro-wire (L), which results in a further lowering in the capacitance between adjacent micro-wires correspondingly. This is effective especially in the case of parallel arranging of signal lines whose transmission loss is required to be decreased.

As is evident from the above explanation, the present invention enables fabrication of a high-frequency integrated semiconductor, comprising micro-wires of a cross-sectional shape where at least one side portions is opened, thereby exhibiting the effect of increasing the surface area of wiring to inhibit or decrease the increased of resistance due to the skin effect as well as of inhibiting the increase of the capacitance between adjacent micro-wires accomplished by narrowing the width of a micro-wire or the space between adjacent micro-wires microscopically.

When such wiring is applied to spiral inductor, it will give the effect of inhibiting the decrease of resonant frequency.

As a further alternative example, the same effect can be achieved in the case with micro-wires of a cross-sectional shape where both side portions are opened to form a "T" shape cross section, or "I" shape or "H" shape turned sideways (see FIG. 5).

This structure can be prepared, for example, by following steps.

Figure 5A:
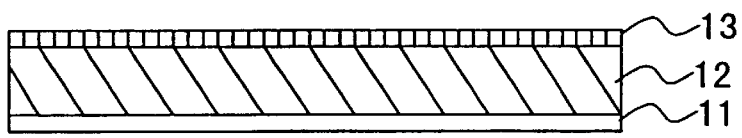
FIG. 5 is a cross-sectional view showing the steps of preparing a third embodiment of the present invention.

At first, a plating feed layer 13 is formed on an insulating film 12 laid on a semiconductor substrate 11 by sputtering or other method (see FIG. 5(a)).

Figure 5B:
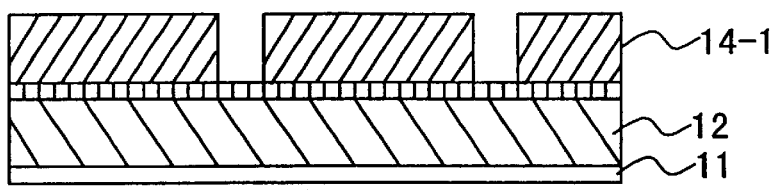

Next, on the plating feed layer 13, photoresist 14-1 is coated and then exposed and developed in accordance with usual lithographic technology to form a predetermined pattern (see FIG. 5(b)).

Figure 5C:
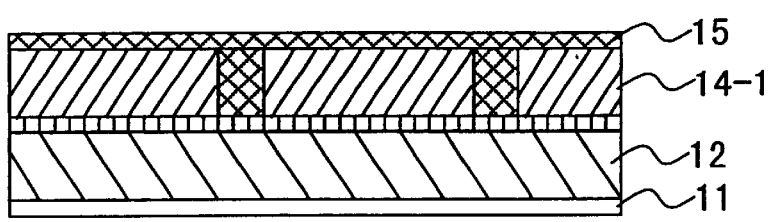

Then, a plating feed layer 13 formed by sputtering etc., and a gold plating 15 of around 300 nm thick in accordance with electro- or electroless-plating are applied to form a wiring portion (see FIG. 5(c)).

Figure 5D:
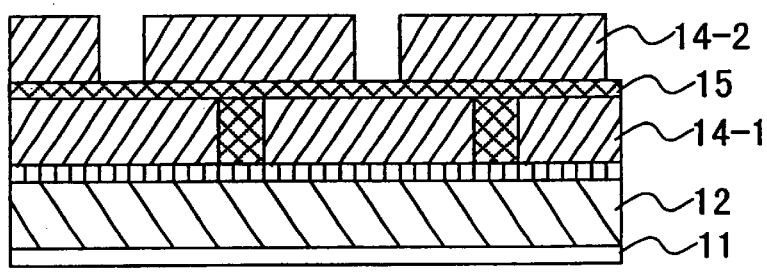

Subsequently, on the resultant gold plating 15, photoresist 14-2 is coated and then exposed and developed in accordance with usual lithographic technology to form a predetermined pattern (see FIG. 5(d)).

Figure 5E:
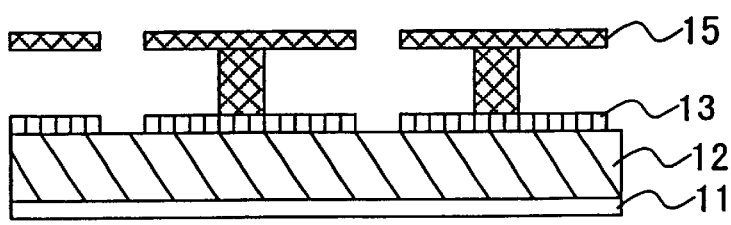

The gold plating 15 and the plating feed layer 13 except for -the wiring portion are etched off by the application of an appropriate etching technology such as ionic milling etc., thereafter, the photoresists 14-1 and 14-2 are removed to form micro-wires in which the both direction of the side portion are opened so that the cross-section of the gold plating 15 and the plating feed layer 13 has a T-shape (see FIG. 5(e)).

It should be noted that modifications may be done in the art within the concept and scope as disclosed herein and claimed by the appended claims.

What is claimed is:

1. A semiconductor device comprising a wiring system having an insulating film and micro-wire or wires of metal conductor formed thereon, said micro-wires having a recess in one side portion thereof to form a cross-sectional reverse L-shape, said reverse L-shape having a foot portion contacting said insulating film and an arm portion supported by said foot portion wherein said arm portion of the micro-wires is longer than said foot portion of the micro-wires, wherein said reverse L-shape provides an enlarged space between adjacent micro-wires to minimize capacitance therebetween, wherein a space between sides of adjacent micro-wires is a sum of a space between adjacent micro-wires (S) and a width of said micro-wires (L), and wherein the recess and the space between adjacent micro-wires, defined by the cross-sectional shape of the micro-wires, are substantially hollow below the arm portion of adjacent micro-wires to minimize the parasitic capacitance and skin effect influence.

2. A semiconductor device comprising a wiring system having an insulating film and micro-wire or wires of metal conductor formed thereon, said micro-wires having a recess in one side portion thereof to form a cross-sectional reverse L-shape, said reverse L-shape having a foot portion contacting said insulating film and an arm portion supported by said foot portion wherein said arm portion of the micro-wires is longer than said foot portion of the micro-wires, wherein said reverse L-shape provides an enlarged space between adjacent micro-wires to minimize capacitance therebetween, wherein a space between sides of adjacent micro-wires is a sum of a space between adjacent micro-wires (S) and a width of said micro-wires (L), and wherein the recess and the space between adjacent micro-wires, defined by the cross-sectional shape of the micro-wires, are substantially hollow below the arm portion of adjacent micro-wires to minimize the parasitic capacitance and skin effect influence, said wiring system further comprises a plating feed layer formed on said insulating layer to contact said foot portion of said plating feed layer, and said arm portion being opposed to said plating feed layer to transform the cross-sectional shape of said micro-wires into a U-shape with the U being turned sideways.

3. A semiconductor device comprising a wiring system having an insulating film and micro-wire or wires of metal conductor formed thereon, said micro-wires having a recess in one side portion thereof to form a cross-sectional reverse L-shape, said reverse L-shape having a foot portion contacting said insulating film and an arm portion supported by said foot portion wherein said arm portion of the micro-wires is longer than said foot portion of the micro-wires, wherein said reverse L-shape provides an enlarged space between adjacent micro-wires to minimize capacitance therebetween, wherein a space between sides of adjacent micro-wires is a sum of a space between adjacent micro-wires (S) and a width of said micro-wires (L), and wherein the recess and the space between adjacent micro-wires, defined by the cross-sectional shape of the micro-wires, are substantially hollow portions below the arm portion of adjacent micro-wires to minimize the parasitic capacitance and skin effect influence, wherein the recessed side portion of said micro-wire is formed on an opposite side of the recessed portion of the adjacent micro-wire.

4. A spiral inductor having an insulating film and micro-wire or wires of metal conductor, said micro-wires having a recess in one side portion thereof at a same side for each adjacent micro-wire, to form a cross-sectional reverse L-shape, said reverse L-shape having a foot portion contacting said insulating film and an arm portion supported by said foot portion wherein said arm portion of the micro-wires is longer than said foot portion of the micro-wires, wherein said reverse L-shape provides an enlarged space between adjacent micro-wires to minimize capacitance therebetween, wherein a space between sides of adjacent micro-wires is a sum of a space between adjacent micro-wires (S) and a width of said micro-wires (L), and wherein the recess and the space between adjacent micro-wires, defined by the cross-sectional shape of the micro-wires, are substantially hollow below the arm portion adjacent to the micro-wires to minimize the parasitic capacitance and skin effect influence.

5. A semiconductor device comprising a wiring system having an insulating film and micro-wire or wires of metal conductor formed thereon, said micro-wires having a recess in one side portion thereof to form a cross-sectional reverse L-shape, said reverse L-shape having a foot portion contacting said insulating film and an arm portion supported by said foot portion wherein said arm portion of the micro-wires is longer than said foot portion of the micro-wires, wherein the recesses of pairs of adjacent micro-wires face each other to provide an enlarged space between adjacent micro-wires to minimize capacitance therebetween, wherein a space between sides of adjacent micro-wires is a sum of a space between adjacent micro-wires (S) and twice a width of said micro-wires (2L), and wherein the recess and the space between adjacent micro-wires, defined by the cross-sectional shape of the micro-wires, are substantially hollow below the arm portion of adjacent micro-wires to minimize the parasitic capacitance and skin effect influence.

6. A semiconductor device comprising a wiring system having an insulating film and micro-wire or wires of metal conductor formed thereon, said micro-wires having a recess in one side portion thereof to form a cross-sectional reverse L-shape, said reverse L-shape having a foot portion contacting said insulating film and an arm portion supported by said foot portion wherein said arm portion of the micro-wires is longer than said foot portion of the micro-wires, wherein the recesses of pairs of adjacent micro-wires face each other to provide an enlarged space between adjacent micro-wires to minimize capacitance therebetween, wherein a space between sides of adjacent micro-wires is a sum of a space between adjacent micro-wires (S) and twice a width of said micro-wires (2L), and wherein the recess and the space between adjacent micro-wires, defined by the cross-sectional shape of the micro-wires, are substantially hollow below the arm portion of adjacent micro-wires to minimize the parasitic capacitance and skin effect influence, said wiring system further comprises a plating feed layer formed on said insulating layer to contact said foot portion of said plating feed layer, and said arm portion being opposed to said plating feed layer to transform the cross-sectional shape of said micro-wires into a U-shape with the U being turned sideways.

7. A semiconductor device comprising a wiring system having an insulating film and micro-wire or wires of metal conductor formed thereon, said micro-wires having a recess in one side portion thereof to form a cross-sectional reverse L-shape, said reverse L-shape having a foot portion contacting said insulating film and an arm portion supported by said foot portion wherein said arm portion of the micro-wires is longer than said foot portion of the micro-wires, wherein the recesses of pairs of adjacent micro-wires face each other to provide an enlarged space between adjacent micro-wires to minimize capacitance therebetween, wherein a space between sides of adjacent micro-wires is a sum of a space between adjacent micro-wires (S) and twice a width of said micro-wires (2L), and wherein the recess and the space between adjacent micro-wires, defined by the cross-sectional shape of the micro-wires, are substantially hollow portions below the arm portion of adjacent micro-wires to minimize the parasitic capacitance and skin effect influence, wherein the recessed side portion of said micro-wire is formed on an opposite side of the recessed portion of the adjacent micro-wire.

8. A spiral inductor having an insulating film and micro-wire or wires of metal conductor, said micro-wires having a recess in one side portion thereof at a same side for each adjacent micro-wire, to form a cross-sectional reverse L-shape, said reverse L-shape having a foot portion contacting said insulating film and an arm portion supported by said foot portion wherein said arm portion of the micro-wires is longer than said foot portion of the micro-wires, wherein the recesses of pairs of adjacent micro-wires face each other to provide an enlarged space between adjacent micro-wires to minimize capacitance therebetween, wherein a space between sides of adjacent micro-wires is a sum of a space between adjacent micro-wires (S) and twice a width of said micro-wires (2L), and wherein the recess and the space between adjacent micro-wires, defined by the cross-sectional shape of the micro-wires, are substantially hollow below the arm portion adjacent to the micro-wires to minimize the parasitic capacitance and skin effect influence.

\* \* \* \* \*